(12) United States Patent
Bellinghausen et al.

(10) Patent No.: US 6,616,461 B2
(45) Date of Patent: Sep. 9, 2003

(54) ASSEMBLY FOR MOUNTING A BRIDGE RECTIFIER TO A PRINTED WIRING BOARD

(75) Inventors: Carl Peter Bellinghausen, Newton, NJ (US); Patrick M. Povilaitis, Oakridge, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/775,863

(22) Filed: Feb. 2, 2001

(65) Prior Publication Data

US 2002/0106915 A1 Aug. 8, 2002

(51) Int. Cl.[7] .............................................. H05K 1/00
(52) U.S. Cl. ............................................ 439/68; 439/74
(58) Field of Search ........................... 439/74, 75, 620, 439/76.1, 76.2, 68, 69, 70, 71, 72, 73, 621, 622, 638, 650–655, 945

(56) References Cited

U.S. PATENT DOCUMENTS

| | | | |
|---|---|---|---|
| 4,045,105 A | * | 8/1977 | Lee et al. ...................... 439/69 |
| 4,539,621 A | * | 9/1985 | Currier ....................... 361/386 |
| 4,618,739 A | * | 10/1986 | Theobald ................. 174/52 FP |
| 5,192,215 A | * | 3/1993 | Grabbe et al. .............. 4739/73 |

* cited by examiner

Primary Examiner—Ross Gushi

(57) ABSTRACT

The problem of locating a bridge rectifier on a printed wiring board and doing so economically is solved and a technical advance achieved by an assembly comprised of a first member mounted directly on the printed wiring board and a second member which connects a bridge rectifier to the first member. The first member has a first set of discrete contacts adapted to be soldered to conductive paths on the printed wiring board and a second set of contacts each coupled to one of the first set of contacts. The first member supports an opening that extends therethrough and is sized to accept a bridge rectifier. The second member supports a third set of contacts which are adapted to engage the second set of contacts and a fourth set of contacts each one of which is electrically coupled to one of the third set of contacts. The fourth set of contacts are spaced to engage the contacts of a bridge rectifier and are located to position the bridge rectifier within the opening of the first member, or are located to position the bridge rectifier beyond the opening of the first member. In addition, the fourth set of contacts can be two sets of contacts for positioning the bridge rectifier on either side of the second member.

12 Claims, 3 Drawing Sheets

ASSEMBLY FOR MOUNTING A BRIDGE RECTIFIER TO A PRINTED WIRING BOARD

BACKGROUND OF THE INVENTION

1. Field of the Invention

The present invention relates generally to a socket assembly and more particularly to an assembly for removably coupling an electronic component to conductive paths on a printed wiring board.

2. Description of the Related Art

High speed logic circuits contained in integrated circuit semiconductor chips typically require at least one DC supply voltage at various circuit locations. In telecommunication systems, bridge rectifiers are commonly used to provide the required DC supply voltages and/or to protect electronic circuits from voltages of reverse polarity. In the U.S., positive 24 volts are normally used to power the telecommunications equipment. Foreign telecommunication equipment operates according to a different standard and is normally powered by negative 48 volts. These supply voltages are presently provided by means of a bridge rectifier typically contained in a separate module that is mounted at a location remote from the printed wiring board on which the logic circuits are located. The DC current provided by the bridge rectifier is typically conductively coupled to the printed wiring board by means of a wire harness which couples the bridge rectifier to the printed wiring board. The wire harness can be three feet or more in length. On the printed wiring board the current flows through thin-film conductive paths to integrated telecommunication circuit packages. All of the power to the telecommunications circuits on the printed wiring board passes through the bridge rectifier. Currently, for various reasons, bridge rectifiers that are mounted on printed wiring boards are normally limited to operate at a current of only 1 amp or less.

Industry standard high power 20 and 35 amp bridge rectifiers are not currently mounted on the surface of a printed wiring board. Some of the reasons for this are:

1. The use of Faston or wire wrap terminals are labor intensive and required the use of costly pigtail attachments to the printed wiring board; and
2. Printed wiring boards that have through hole solderable connections do not support conduction cooled applications which is the normal method of cooling a bridge rectifier.

The present day method of electrically coupling a bridge rectifier to integrated chips on a printed wiring board is by mounting the bridge rectifier to a heat conducting plate which may be located three or more feet from the printed wiring board and connecting the bridge rectifier to the printed wiring board with wire conductors. The use of wire conductors creates difficulties in maintaining a constant and regulated DC supply voltage at the integrated circuit chips. One such difficulty results from variations in the voltage drop in the wire leads between the bridge rectifier and the contacts of the integrated chips. As the length of the wire leads increases, the resistance of the leads increases. Additionally, as the complexity of the circuits in an integrated circuit chip increases, which normally causes a corresponding increase in the amount of current demanded by the integrated circuit chips, variations in the current demand during normal operation of the integrated circuit chip results in variations in the voltage drop across the power supply lines. Normally, the voltage drop along the supply lines can be reduced by increasing the cross sectional area of the conductors as much as possible. Unfortunately, when current demand is high and the constraints on the printed wiring board space is significant, then a designer may not be able to increase the size of the metal conductive paths enough to provide DC supply voltages which are adequate to guarantee proper operation of integrated circuits that have high transient or continuous loading characteristics.

Another drawback with the bridge rectifier not being located on the printed wiring board is the time it takes for the power supply to sense a change in current demand of the integrated circuits. Shorter path lengths between the integrated circuits and the DC power supply allows for more rapid correction of the output voltages generated by the power supply when the level of the output voltage is either above or below a specified value.

There is an unfulfilled need for a structure which can be used to mount a high power bridge rectifier quickly and economically onto the surface of a printed wiring board.

SUMMARY OF THE INVENTION

The problem of locating a bridge rectifier on a printed wiring board and doing so economically is solved and a technical advance achieved by an assembly comprised of a first member mounted directly on the printed wiring board and a second member which connects a bridge rectifier to the first member. The first member has a first set of discrete contacts adapted to be soldered to conductive paths on the printed wiring board and a second set of contacts each coupled to one of the first set of contacts. The first member supports an opening that extends therethrough and is sized to accept a bridge rectifier. The second member supports a third set of contacts which are adapted to engage the second set of contacts and a fourth set of contacts each one of which is electrically coupled to one of the third set of contacts. The fourth set of contacts are spaced to engage the contacts of a bridge rectifier and are located to position the bridge rectifier within the opening of the first member, or are located to position the bridge rectifier beyond the opening of the first member. In addition, the fourth set of contacts can be two sets of contacts for positioning the bridge rectifier on either side of the second member.

BRIEF DESCRIPTION OF THE DRAWINGS

The features and advantages of the present invention will become more apparent from the detailed description set forth below when taken in conjunction with the drawings in which like reference numerals of the figures identify corresponding similar parts and wherein.

DETAILED DESCRIPTION

Figure 1:
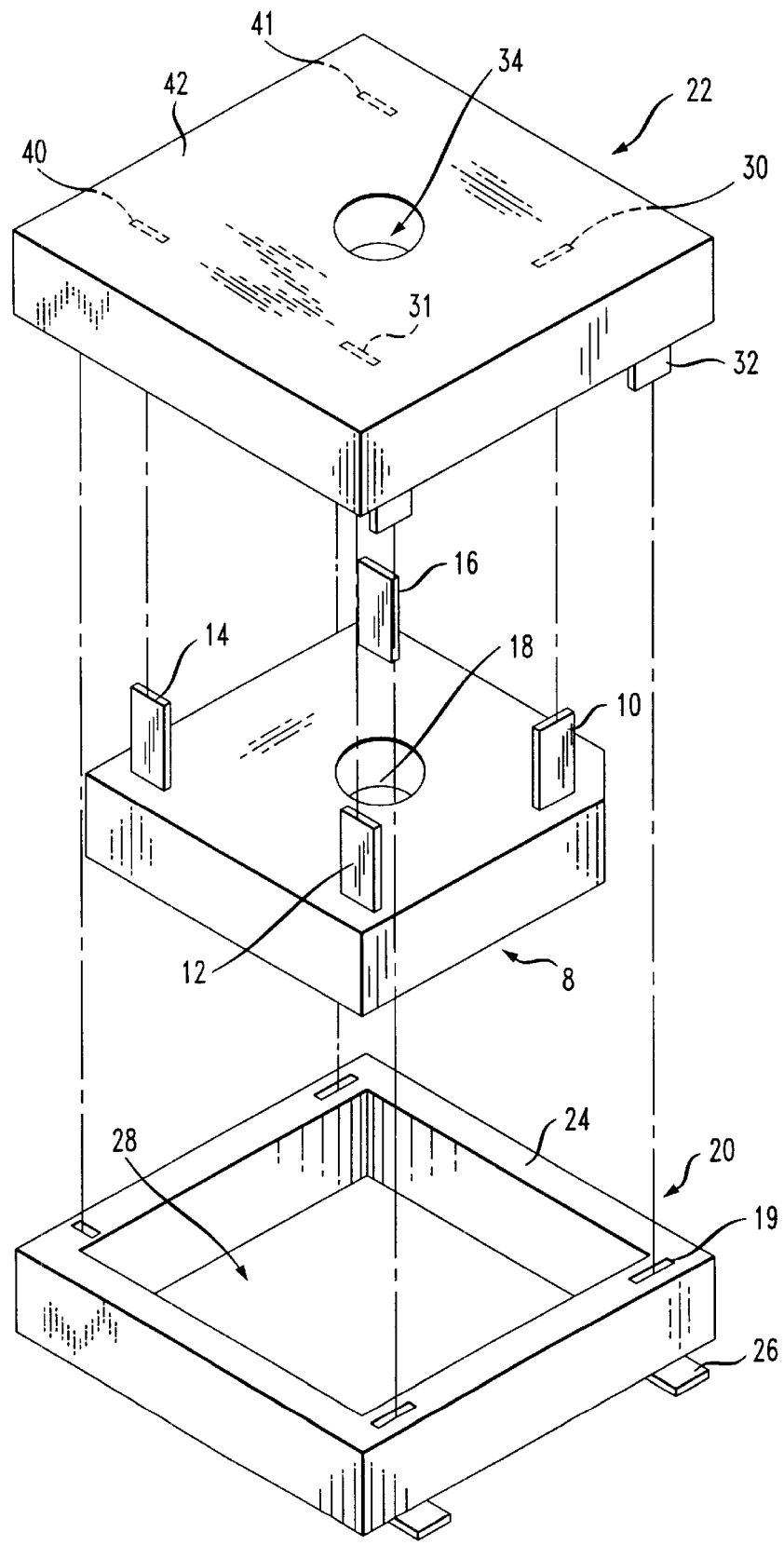
FIG. 1 is a perspective of an exploded view of an assembly for coupling a bridge rectifier to conductive paths on a printed wiring board for conduction cooling of the bridge rectifier.

Referring to FIG. 1, there is illustrated an exploded view of a socket for coupling a bridge rectifier to conductive paths on a printed wiring board.

Bridge rectifiers are manufactured by various manufacturers located in the U.S. and in foreign countries. In the U.S, bridge rectifiers are manufactured by General Semiconductor, Fairchild Semiconductor, Diotec Electronics Corp., Carrollton Semiconductor, etc. A bridge rectifier is normally encased within a molded plastic body 8 and is electrically connected to four male contacts 10, 12, 14 16. Contact 10, which is oriented 90 degrees relative to the other contacts, is the positive DC voltage supply, and contact 14, located diagonally across from contact 10 is the negative DC voltage supply. Contacts 12 and 16 are connected to an AC voltage supply. The molded body of the bridge rectifier supports a centrally located opening 18 sized to receive a screw such as a No. 10 screw which is used to secure the bridge rectifier to a printed wiring board. The bridge rectifier body contains an integrally molded heat sink designed to provide very low thermal resistance for maximum heat dissipation. The heat sink is immediately below or at the surface of the bridge rectifier opposite the contacts 10, 12, 14, 16.

Figure 2:
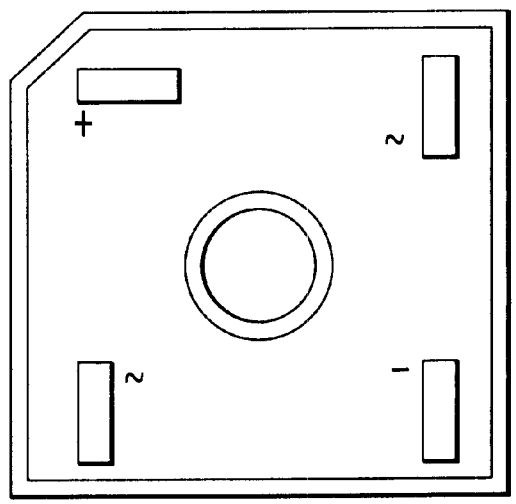
FIGS. 2 and 3 illustrate the dimension between the contacts of bridge rectifiers of two different manufacturers.
Figure 3:
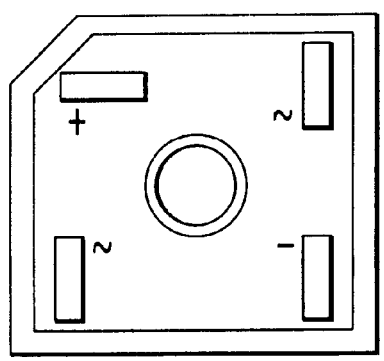

Each manufacturer provides bridge rectifiers with contacts that have slightly different spacings. FIG. 2 shows the minimum and maximum spacings of the contacts of a General Semiconductor® bridge rectifier. FIG. 3 shows the minimum and maximum spacings of the contacts of a Fairchild Semiconductor™ bridge rectifier. It is to be noted that there are slight spacing differences of the contacts of the bridge rectifier of the two manufacturers.

There are two basic ways of mounting a bridge rectifier. One way is to couple a heat dissipating member to the top surface of the bridge rectifier to help dissipate the heat away from the integrally molded heat sink by conduction; and the other method is to expose the top surface of the bridge rectifier to a flow of moving air to remove heat by convection.

Frequently, with telecommunication equipment, the top surface of the bridge rectifier is coupled to a metal plate such as aluminum to help dissipate the heat generated. In addition, the contacts of the bridge rectifier are male contacts designed for contact with a female contact or to snap-on terminals or to a wire wrap-around. They are not designed to be soldered. Furthermore, the plastic bodies of bridge rectifiers are not designed to withstand the heat required and used when components are machine soldered to a printed wiring board.

Clearly, therefore, a bridge rectifier that is to be mounted directly onto a printed wiring board cannot be soldered to contacts on the board by an automated process. In addition, it is neither practical nor economical to connect a bridge rectifier by wire wrap-around as this procedure is slow and expensive.

Referring to FIG. 1, there is illustrated an assembly for coupling a bridge rectifier directly to a printed wiring board where the top surface of the bridge rectifier is oriented to be in direct contact with the surface of the printed wiring board to help in dissipating the heat that is generated within the bridge rectifier by conduction.

The assembly is comprised of a first or bottom member 20 and a second or top member 22. The first member supports four female contacts 19 each of which extends from a top surface 24, through the body and out of the bottom surface where the protruding ends 26 are bent to extend outward. The outward extending ends 26 can be tinned to facilitate connections to conductive tabs on the printed wiring board (not illustrated) by automated high temperature soldering techniques or the like. The first member 24 supports an opening 28 which can be square and sized to accept the bridge rectifier where the top surface of the bridge rectifier faces downward and contacts the printed wiring board. The bottom surface of the bridge rectifier and the contacts 10, 12, 14, 16 face upward. The thickness of the first member is slightly less than the thickness of the bridge rectifier. This difference in thickness permits the heat sink, which is integrally molded within the top surface of the bridge rectifier, to make direct and positive contact with the printed wiring board when the second member 22 is assembled to the first member 20. Member 20 is of an insulating plastic material which is not adversely affected by the heat used during the automated soldering process.

The second member 22 supports four female contacts 30, 31, 40, 41 located within its lower surface and spaced to receive the four male contacts of the bridge rectifier. Each female contact is electrically connected to a specific male contact 32 via a conductor located within the body of the second member 22, where the male contacts 32 project downward and are positioned to engage female contacts 19 located in the top surface of first member 20.

An opening 34 extends through the top member 22 and is sized to accept a fastening means such as a No. 10 screw. Opening 34 is located to be aligned with opening 18 in the bridge rectifier when the contacts 10, 12, 14, 16 engage contacts 30, 31, 40, 41. The screw, when positioned within the openings 34, 18, which are aligned with an opening in the printed wiring board (not illustrated), can be captured by a nut located under the printed wiring board to secure the first member, second member and bridge rectifier to the printed wiring board to provide a positive heat conducting contact between the heat sink in the bridge rectifier and the printed wiring board. Normally a printed wiring board has no conductor paths on the lower surface. Therefore, to help assist in the dissipation of heat generated by the bridge rectifier, an aluminum plate can be positioned to contact the lower surface of the printed wiring board.

As noted in FIGS. 2 and 3, the spacings of the projecting male contacts of the bridge rectifier of different manufacturers are slightly different. To accommodate these small differences, the female contacts located in the lower surface of the second member 22 are designed to float, that is, they are designed to accommodate male contacts of slightly different dimensions and spacings by having yieldable spring loaded contacts.

In operation, the first member 20 is located on and soldered to a printed wiring board where the contacts 26 on the first member are soldered to conductive paths on a printed wiring board (not illustrated). The first member 20 is of a plastic material which is not adversely affected by the heat of the soldering process. Thereafter, a bridge rectifier 8 is connected to the second member 22 by inserting the male contacts 10, 12, 14, 16 of the bridge rectifier into the female contacts 30, 31, 40, 41 of the second member 22. Proper positioning of the bridge rectifier relative to the second member is insured by the rotational displacement of the female contact 30 and the male contact 10 relative to the other contacts. The second member 22 together with the bridge rectifier 8 are then connected to the first member 20 and to the printed wiring board by inserting the male contacts 32 of the second member 22 into the female contacts 19 of the first member 20. Again, the male and female contacts on the second member and the first member are oriented to permit the second member to engage the first member in only one specific orientation. A screw inserted through the openings 34 in the second member and 18 in the bridge rectifier will be aligned with an opening in the printed wiring board and can engaged a nut located beneath the printed wiring board to lock the assembly together with the heat sink of the bridge rectifier being in direct and positive contact with the surface of the printed wiring board. If desired, particularly in those instances where there are no conductive traces on the bottom surface of the printed wiring board, a sheet of aluminum can be coupled to the bottom surface of the printed wiring board to enhance the transference of heat away from the bridge rectifier.

Figure 4:
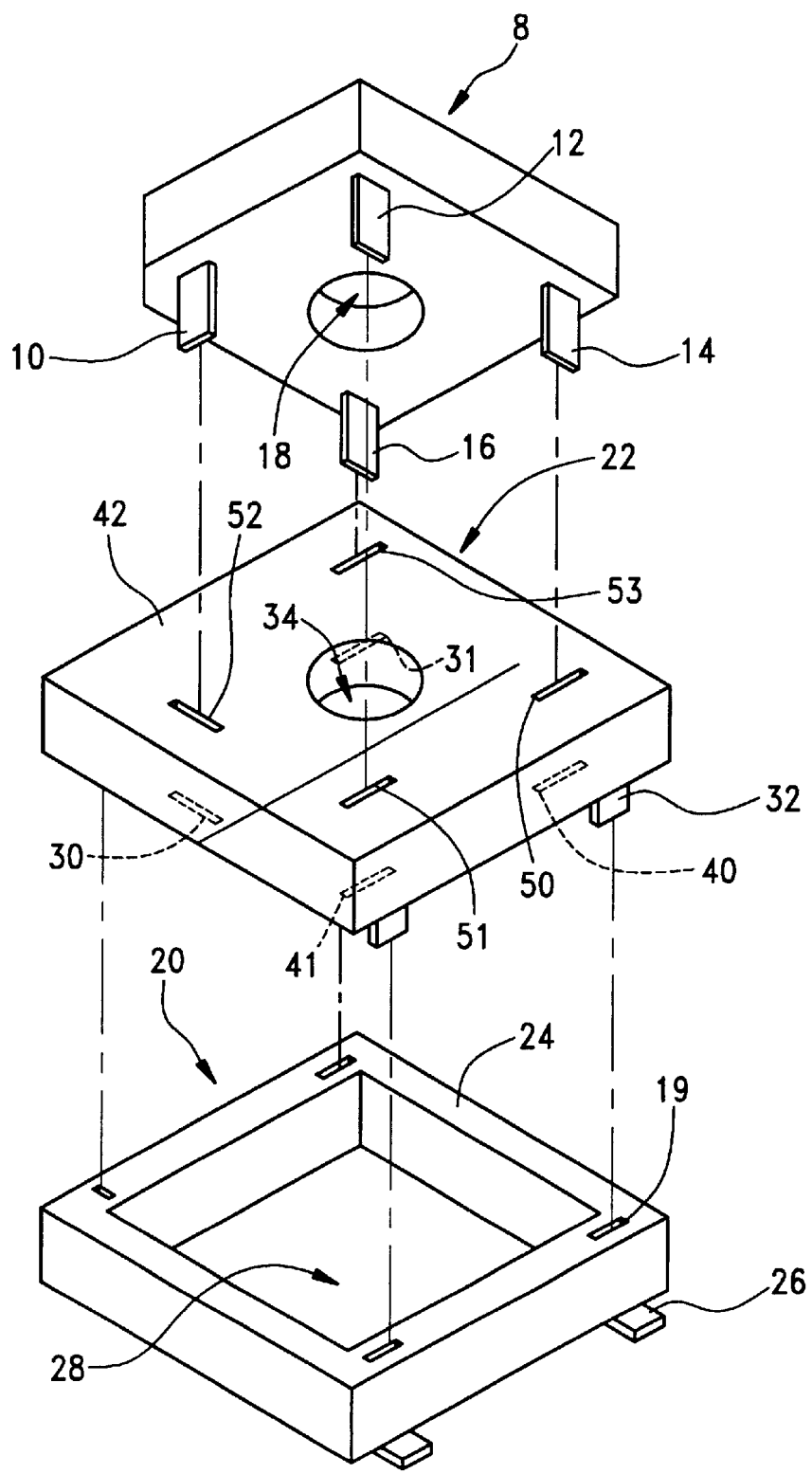
FIG. 4 is a perspective of an exploded view of another embodiment of an assembly for coupling a bridge rectifier to conductive paths on a printed wiring board for conduction cooling of the bridge rectifier.

In some installations, it may be desirable to position the bridge rectifier with its heat sink not in contact with the printed wiring board. One such instance may be where there is ample spacing between stacked printed wiring boards or the heat generated within the bridge rectifier can be more easily removed by convection means such as by attaching conducting fins to the top surface of the bridge rectifier and/or moving air over the top surface of the bridge rectifier. Referring to FIG. 4, in these instances, the second member 22 supports a set of female contacts 50, 51, 52, 53 located in the second surface 42. The female contacts 50, 51, 52, 53 are spaced and oriented to accept male contacts 10, 12, 14, 16 of the bridge rectifier 8. In this embodiment, the bridge rectifier is located on the top surface of the second member 22 and can be cooled by connecting a plate having cooling fins to the top surface of the bridge rectifier. By including two sets of female contacts within the second member 22, one set accessible from the surface which supports projecting male contacts 32 and the second set of female contacts accessible from the surface opposite to that which supports the male contacts 32, the second member is adapted to receive a bridge rectifier oriented with its heat sink either contacting or not contacting the printed wiring board. In the design of the second member 22, care must be exercised to insure that each female contact 30, 31, 40, 41, which is accessible from bottom surface of the member, and each female contact 50, 51, 52, 53, which is accessible from the top surface of the member, makes electrical contact with the proper male protruding contacts 32.

In those instances where it is known that the bridge rectifier will be used with its male contacts facing the printed wiring board and the heat sink of the bridge rectifier will not contact the printed wiring board, the lower member 20 can be designed to allow the male contacts of the bridge rectifier to engage the female contacts 19 of the first lower member. This embodiment is not illustrated.

While this invention has been particularly shown and described with reference to two preferred embodiments thereof, it will be understood by those skilled in the art that various changes and modifications in form and details may be made without departing from the scope and spirit of the invention as defined in the appended claims. Accordingly, it is intended that the appended claims cover any such modifications or embodiments that fall within the scope of the invention.

The invention claimed is:

1. An assembly for coupling an electronic component to conductive paths on a printed wiring board comprising:
 a first member supporting a first set of discrete contacts, first ends of said first set of contacts being adapted to be coupled to conductive paths on the printed wiring board,
 a second member supporting a second set of discrete contacts, first ends of said second set of contacts being adapted to be removably coupled to second ends of the first set of discrete contacts, and
 second ends of said second set of discrete contacts being adapted to be electrically coupled to an electronic component,
 said first set of contacts being electrically, but not physically, in contact with leads of said electronic component,
 the first member forming a wall defining an opening sized to accept the electronic component, the opening extending through the first member, and
 wherein the first member having a thickness that is less than the thickness of the electronic component.

2. The assembly of claim 1 wherein the second member comprises a first surface and a second surface opposite the first surface and where the first and second ends of the second set of discrete contacts are coupled to the first surface.

3. The assembly of claim 2 wherein the second member supports an opening adapted to receive a fastening means to couple the first and second members to a printed wiring board.

4. The assembly of claim 1 wherein the electronic component comprises a bridge rectifier.

5. The assembly of claim 1 wherein the first ends of the second set of discrete contacts are adapted to be removably coupled to the second ends of the first set of contacts.

6. An assembly for coupling an electronic component to conductive paths on a printed wiring board comprising:
 a first member supporting a first set of discrete contacts, first ends of said first set of contacts being adapted to be coupled to conductive paths on the printed wiring board,
 a second member supporting a second set of discrete contacts, first ends of said second set of contacts being adapted to be removably coupled to second ends of the first set of discrete contacts, and
 second ends of said second set of discrete contacts being adapted to be electrically coupled to an electronic component,
 said first set of contacts being electrically, but not physically, in contact with leads of said electronic component,
 wherein the first member supports an opening sized to accept the electronic component,
 wherein the opening extends through the first member,
 wherein the first member forms a wall which defines the opening;
 wherein the first member and the opening in the first member has a thickness that is less than the thickness of the electronic component,
 the first ends of the first set of discrete contacts extend outward from the first member,
 the second ends of the first set of discrete contacts are female ends,
 the first ends of the second set of discrete contacts are male ends oriented and spaced to engage the second ends of the first set of discrete contacts, and
 the second ends of the second set of discrete contacts are female ends oriented and spaced to engage male ends to a third set of contacts of a bridge rectifier, wherein the bridge rectifier is adapted to be located within the opening in the first member when the bridge rectifier is coupled to the second ends of the second set of discrete contacts of the second member and the second member is coupled to the first member.

7. An assembly for coupling an electronic component to conductive paths on a printed wiring board comprising:
 a first member supporting a first set of discrete contacts, first ends of said first set of contacts being adapted to be coupled to conductive paths on the printed wiring board, a second member supporting a second set of discrete contacts, first ends of said second set of contacts being adapted to be removably coupled to second ends of the first set of discrete contacts, and second ends and third ends, respectively, of said second set of discrete contacts being adapted to be electrically coupled to an electronic component, wherein the second member comprises a first surface and a second surface opposite the first surface; and where first ends and third ends of the second set of discrete contacts are coupled to the first surface and second ends of the second set of discrete contacts are coupled to the second surface.

8. The assembly of claim 7 wherein the second member supports an opening adapted to receive a fastening means to couple the first and second members to a printed wiring board.

9. The assembly of claim 7 further comprising a third set of discrete contacts first ends of which are removably coupled to said second ends of said second set of discrete contacts and where second ends of said third set of contacts are adapted to be coupled to said electronic component.

10. The assembly of claim 7 wherein said first ends of the first set of discrete contacts extend outward from the first member, the second ends of the first set of discrete contacts are female ends, the first ends of the second set of discrete contacts are male ends oriented and spaced to engage the female ends of the first set of discrete contacts, the second ends of the second set of discrete contacts are female ends oriented and spaced to engage the male ends of a bridge rectifier, wherein the bridge rectified is located adjacent to the second surface and not within an opening in the first member when the bridge rectifier is coupled to the second ends of the second set of discrete contacts of the second member and the second member is coupled to the first member.

11. The assembly of claim 7 wherein the electronic component comprises a bridge rectifier.

12. The assembly of claim 7 wherein the first ends of the second set of discrete contacts are adapted to be removably coupled to the second ends of the first set of contacts.

* * * * *